(12) United States Patent
Birnstock et al.

(10) Patent No.: US 7,544,383 B2
(45) Date of Patent: Jun. 9, 2009

(54) METHOD FOR APPLYING MECHANICALLY SENSITIVE LAYERS TO A SUBSTRATE OVER A LARGE AREA

(75) Inventors: Jan Birnstock, Dresden (DE); Joerg Blaessing, Oberkochen (DE); Karsten Heuser, Erlangen (DE); Matthias Stoessel, Mannheim (DE); Georg Wittmann, Herzogenaurach (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 974 days.

(21) Appl. No.: 10/493,641

(22) PCT Filed: Oct. 11, 2002

(86) PCT No.: PCT/DE02/03842

§ 371 (c)(1),
(2), (4) Date: Apr. 22, 2004

(87) PCT Pub. No.: WO03/038922

PCT Pub. Date: May 8, 2003

(65) Prior Publication Data

US 2004/0247778 A1    Dec. 9, 2004

(30) Foreign Application Priority Data

Oct. 26, 2001    (DE) ................ 101 52 920

(51) Int. Cl.
*B05D 5/12* (2006.01)
(52) U.S. Cl. .............. 427/66; 427/24; 427/58; 427/256; 427/428.01; 313/503; 313/504; 313/505
(58) Field of Classification Search .......... 427/66; 313/503; 428/690; 257/88
See application file for complete search history.

(56) References Cited

U.S. PATENT DOCUMENTS 5,738,008 A    4/1998    Freund (Continued)

FOREIGN PATENT DOCUMENTS

DE    195 32 110    11/1996

(Continued)

OTHER PUBLICATIONS

Birnstock, et al., "Screen-Printed Passive Matrix Displays based on Light-Emitting Polymers", Applied Physics, Jun. 11, 2001, New York, US, Bd. 78, No. 24, pp. 3905-3907, ISSN: 0003-6951.

(Continued)

*Primary Examiner*—Shamim Ahmed
*Assistant Examiner*—Maki Angadi
(74) *Attorney, Agent, or Firm*—Fish & Richardson P.C.

(57) ABSTRACT

A method is described for large-area application of at least two, for example, electroluminescent layers onto a substrate. In a process step A), spacer (5) is structured on the transparent substrate in such a way that, upon application of a second functional layer (11), contact between a first functional layer (10) already applied on the substrate and a part of a printing machine responsible for the transfer of the functional layers onto the substrate is avoided. In two other process steps B) and C), the first functional layer (10) and the second functional layer (15) are applied over a large area, for example, through large-area standard printing methods.

19 Claims, 6 Drawing Sheets

U.S. PATENT DOCUMENTS

| | | | | |
|---|---|---|---|---|
| 5,804,917 | A | * | 9/1998 | Takahashi et al. ............ 313/504 |
| 6,933,537 | B2 | * | 8/2005 | Yee et al. ...................... 257/99 |
| 2002/0158574 | A1 | * | 10/2002 | Wolk et al. .................. 313/504 |
| 2003/0017360 | A1 | * | 1/2003 | Tai et al. ..................... 428/690 |

FOREIGN PATENT DOCUMENTS

| | | |
|---|---|---|
| DE | 199 18 193 A1 | 4/1999 |
| DE | 100 45 204 A1 | 9/2000 |
| EP | 0 892 028 A2 | 1/1999 |
| EP | 0 910 128 A2 | 4/1999 |
| EP | 0 986 112 A2 | 3/2000 |
| EP | 1 065 725 A2 | 1/2001 |
| EP | 1 103 590 A2 | 5/2001 |
| JP | 8-138870 | 5/1996 |
| JP | 2000-231990 | 8/2000 |
| JP | 2001-155858 | 6/2001 |
| WO | WO99/07189 | 2/1999 |
| WO | WO00/76008 A1 | 12/2000 |
| WO | WO02/19443 A1 | 3/2002 |

OTHER PUBLICATIONS

Mori, K. et al., "Organic Light-Emitting Devices Patterned by Screen-Printing", 2000, Japan, J. Appl. Phys., vol. 39, pp. 942-944.

Pardo, D.A. et al., "Application of Screen Printing in the Fabrication of Organic Light-Emitting Devices", Sep. 1, 2000, Advanced Materials, B. 12, Nr. 17, pp. 1249-1252.

* cited by examiner

METHOD FOR APPLYING MECHANICALLY SENSITIVE LAYERS TO A SUBSTRATE OVER A LARGE AREA

BACKGROUND

A method for large-area application of mechanically sensitive layers onto a substrate.

The so-called liquid crystal displays (LCDs) dominate the market of the flat screen fields today. However, besides cost-effective manufacturing, low electrical uptake, low weight and low space requirements, the LCD technique also has severe disadvantages. LCDs do not emit themselves and therefore can be read easily or recognized only when the environmental lighting conditions are especially favorable. In most cases, this requires back-lighting, but this again increases the thickness of the flat screen several times. In addition, the predominant part of the electrical power uptake is then used for illumination and a higher voltage is needed for the operation of the lamps or fluorescent tubes. This is produced mostly with the aid of voltage-up converters from storage batteries. Another disadvantage is the highly limited angle of viewing of simple LCDs and the long switching times of individual pixels, which typically are in the range of a few milliseconds and are highly temperature-dependent. The delayed appearance of the image is extremely disturbing, especially when used in vehicles or in video applications.

Since 1987, displays based on organic light emitting diodes (OLEDs) have become known. These consist in principle of electroluminescent organic layers, which are arranged between two electrodes. When an electric potential is applied to the electrodes, emission of light then occurs due to the recombination between electrons and "holes", which are injected into the organic layer.

OLEDs do not exhibit the disadvantages mentioned above. Due to self-emission, the need for back-lighting is eliminated, which reduces the space requirement and the electrical power uptake considerably. The switching times lie in the region of one microsecond and are only slightly temperature-dependent, which makes use for video applications possible. The reading angle is almost 180°. Polarization films, which are necessary for LCDs, are mostly eliminated, so that greater brightness of the display elements can be achieved. Another advantage is that flexible and nonplanar substrates can be utilized.

In the manufacture of OLEDs, low-molecular organic materials, for example, hydroxyquinoline aluminum(III) salts can be used, which are applied mostly by thermal evaporation onto a corresponding substrate. Displays based on this technology are already commercially available and, at this time, are used mainly in automobile electronics. However, since the manufacture of these components requires numerous process steps under high vacuum, this technology involves disadvantages due to high investment and maintenance costs, as well as relatively low throughput.

Therefore, an OLED technology was developed that uses polymers as organic materials, which can be applied from a solution onto the substrate using wet chemical methods. The vacuum steps necessary for producing the organic layers are eliminated with this technology. At the present time, the electroluminescent polymers are applied mostly with the aid of a rotary centrifugal method. This method has a number of disadvantages:

The majority of the polymer solution (about 99%) is lost irrevocably, the centrifuging process takes a relatively long time (about 30 to 60 seconds) and, moreover, it is almost impossible to apply homogeneous polymer layers onto large substrates.

In the OLEDs, frequently multilayer functional polymer layers are used that consist of, for example, hole transport polymers and emitter polymers. It is known from publication EP 0 892 028 A2 that functional layers can be applied into the window of a window layer with the aid of a contactless ink-jet printing method, which defines the pixels. However, with the aid of this contactless printing method, multilayer functional layers can also be produced. However, using the ink-jet printing method, smooth surfaces are very difficult to coat homogeneously. Moreover, ink-jet printing methods are very time-consuming and thus costly.

A number of standard printing methods are known from publication WO 99/07189, for example, a roll printing method, offset printing method, as well as screen printing method, for the application of electroluminescent polymers. These standard printing methods have the great advantage that, with them, functional layers can be applied onto large areas very rapidly and cost-effectively. However, problems arise with these standard printing methods when two or more functional polymer layers applied on top of one another or next to one another. In this case, the part of the printing device which is responsible for the transfer of the functional layers, for example, the screen, the template, the dabber or the roll, penetrates into the already applied mechanically sensitive polymer layer and damages it. Among others, the power of the OLED display produced in this way suffers, too, so that one must expect a shortening of the life and nonhomogeneous illumination of the display.

SUMMARY

The task of the invention is to provide a method for the preparation of OLED displays with the aid of large-area standard printing methods that can be used to apply mechanically sensitive polymers onto a substrate, avoiding the disadvantages mentioned above.

This task is solved by a manufacturing method for applying layers on a substrate. The method includes forming spacers on a substrate and forming a first functional layer on the substrate so that a first portion of the first functional layer is between the spacers. A second functional layer is printed on the first functional layer with a printing device. The spacers prevent contact between the first portion of the first functional layer and a part of the printing device responsible for printing the second functional layer.

Advantageous embodiments of the manufacturing method may include forming the spacers such that adjacent spacers have a maximum distance that is less than a smallest dimension of a part of the printing device responsible for printing the second functional layer. When the second functional layer is printed, the part of the printing device responsible for printing the second functional layer can contact the portion of the first layer that is on the spacers. The spacers can be in strip-like partitions. The spacers can have a height of between about 0.1 and 100 microns, a width between about 0.3 and 300 microns and a distance between each spacer of between about 2 microns and 10 millimeters. The spacers can be formed with a photolithographic technique. The spacers can be printed. The spacers can have a tapered cross section. The substrate can be matted. The substrate can be sandblasted. The functional layers can be printed. Electrode layers can be formed on the substrate. A cover can be applied onto the substrate to cover the first and second functional layers and the electrode layers. Alternatively, the functional layers and the electrode layers can be encapsulated.

FIGS. 1A to 1F explain an example of the method according to the invention in a top view for large-area application of functional, electroluminescent layers which include, in addition to the necessary process steps A), B) and C), a number of optional, additional advantageous process steps.

DETAILED DESCRIPTION

In the manufacturing method according to the invention, spacers are applied onto a substrate in such a way that the part of the printing device that is responsible for the transfer of the functional layers, for example, the screens or printing rolls, can contact only the spacer, but not any other already-applied easily mechanically-damageable layers. Thus, it is possible to apply the spacers before the application of at least two functional mechanically sensitive layers onto the substrate, First, the first functional layer can be applied, followed by the application of the spacer, and then the second functional layer is produced. The method according to the invention includes the structuring of the spacer in a process step A) where, in at least two other process steps B) and C) a first and a second functional layer are applied without the first functional layer being damaged during the application of the second functional layer. Here, it is important that the structuring of the spacer in process step A) be done before the application of the second functional layer (process step C)). The time sequence of steps A) and B) is interchangeable.

The spacers are advantageously structured in such a way that their maximum distance is smaller than the smallest horizontal dimension of the part of the printer, which is responsible for the transfer of the functional layers onto the substrate. The printing roll can be prevented from falling between any peg-shaped spacers and, as a result, from pressing into the already applied functional layers.

The spacers can be structured, for example, in the form of pegs or strip-like partitions. In the case of strip-like partitions, it is advantageous to structure these in such a way that they have an approximate height of 0.1 to 100 μm, an approximate width of 0.3 to 300 μm and an approximate distance from one another of 2 μm to about 10 mm. With these heights and distances of the spacers from one another, large-area functional layers can be applied with a number of large-area standard printing methods, for example, gravure or letterpress methods, such as flexographic printing, planographic printing, such as offset printing and porous printing methods such as screen printing, without damaging the already applied other functional layers. The approximate width of 0.3 to 300 μm in the case of spacers provides sufficient mechanical stability of the spacers so that they will not be damaged by the part of the printing device which is responsible for the transfer of the functional layers.

For example, the spacers can be structured in such a way that a positive or negative photoresist is applied on a large area of the substrate to be printed, then illuminated through a mask and developed. The structured photoresist layer then forms the spacer. However, the spacers can also be applied onto the substrate by printing, for which purpose, for example, a polymer solution can be used.

Since the functional layers have no contact with the first electrode layer in the area of the spacer, these areas will not light up later. For this reason, it is advantageous, in case of light radiation through a transparent substrate, and in the case of a transparent first electrode applied onto the substrate, to make the substrate matte on the side of the viewer, at least in partial areas. The matting is produced by small microscopic depressions in the surface. Each such depression acts as a scattering center for the emitted light. Due to the diffuse distribution of the light and the related homogenization of the emitted radiation, the related homogenization of the emitted light can make the thin spacers almost "invisible" to the viewer of the finished display. If one uses, for example, glass plates as transparent substrates, then these can be roughened by sandblasting and thus made matte. The matting can be done at any time during the process according to the invention.

If the emission of light occurs through a second transparent electrode applied onto the functional layers through a transparent cover, then advantageously, the cover which can be glass or plastic, for example, can be matted.

The material from which the spacers are made is preferably electrically nonconducting, since otherwise the spacers could produce short circuits between the electrode layers of the OLED displays. Moreover, the spacers should be chemically inert toward the functional polymers, so that the spacers cannot enter into any chemical reactions with the polymers and thus change their function.

The method according to the invention will be explained below with the aid of a practical example, as well as several figures.

As already mentioned, in a process step A1), the side of substrate 1 facing the viewer can be matted at least in partial areas, so that, due to the homogenized radiation of light, the spacers to be applied later become quasi "invisible".

Figure 1A:
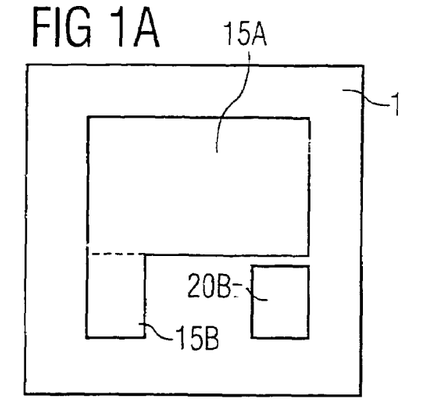
FIGS. 1A to 1F show a possible variation of a method according to the invention, viewed from the top.

FIG. 1A shows a possible process step A3) in which a first electrode layer 15A with an electrically connected first electrode connecting piece 15B and next to it a second electrode connecting piece 20B are applied onto the transparent substrate 1 and then structured. For example, indium-tin oxide (ITO) is used as electrically conducting transparent electrode material, which can be structured with liquid HBr.

Figure 1B:
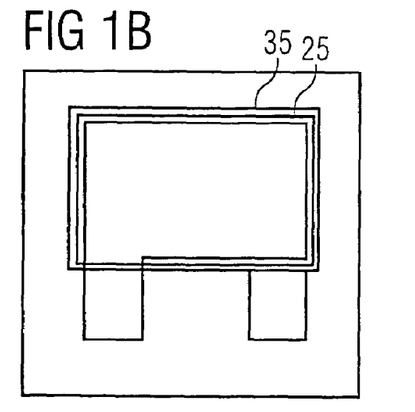

In a next process step A2), as shown in FIG. 1B, a first insulating layer can be applied and then structured into the first strip-like partitions 25. These partitions 25 border the large area where the first and second functional layers will be applied. These first strip-like partitions 25 have the advantage that they prevent running of the functional layer during application. As a result of the polymer solution running, during pressing the thickness of the polymer layer would be reduced, especially at the outer pixels, which would lead to nonhomogeneous illumination and to a reduced life of the display.

Moreover, later, it is possible to provide a cover, for example, a plastic cap to the sensitive functional layer as well as to the oxidation-sensitive second electrode material located on top of it, this plastic cap sealing these parts of the display tightly. Advantageously, the functional layers will not run into the areas of the transparent substrate 1 onto which the later cover is applied. Similarly, those regions of the first and second electrode connecting pieces 15B and 20B, which are introduced under the encapsulation, should not be covered by running functional polymers.

As a rule, the first strip-like partitions 25 consist of four partitions, of which always two partitions are transverse to the other two partitions and form a coherent partition structure, which delineate and define the region on which the functional layers should be applied. Furthermore, it is possible to surround these first four strip-like partitions by other strip-like partitions 35. As a result of this, it becomes possible that, during application of several functional layers, for example, the first functional layer is delineated by the first strip-like partitions 25, where the second functional layer to be applied is then delineated by the partition structure 35.

In contrast to spacers, which can also be produced in the form of strip-like partitions, the first partitions 25 delineate the areas of an OLED, which are printed on a large surface, so that even on a finished display, the function of these partitions can still be clearly recognized. On the other hand, the spacers are on the area of the display onto which the functional layers are applied. In the case of a finished display, these spacers then are completely covered by the functional layers and then do not perform any obvious function anymore.

Figure 1C:
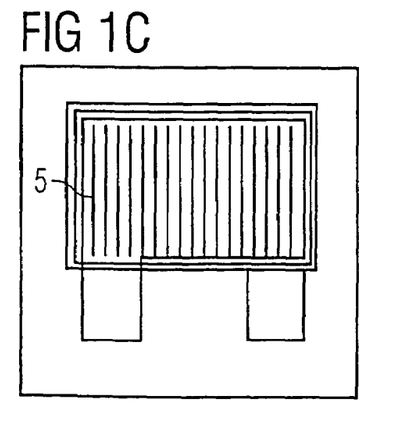

FIG. 1C shows the process step A) in which the spacers 5 are produced in such a way that during later application of a second functional layer, a contact between a first functional layer already located on the substrate and a part of a printing machine responsible for transferring the functional layer onto the substrate is avoided. As already mentioned, the spacers 5 can be structured in such a way that, for example, a photoresist is illuminated and developed through a mask.

Since, later on, a second electrode material is applied on a large area, in process step A), the spacers 5 are advantageously structured in such a way that their regions, which are removed farther from substrate 1, have a cross-section which becomes smaller, that is, show no overhanging edge form (see FIG. 3). This has the advantage that the metal film cannot be separated at spacers, which are structured in such a way that the metal film therefore cannot be separated from the rest of the second electrode material. These partition cross-sections are especially advantageous for those spacers 5 which completely include a part of the area that will be illuminated later. In all other interrupted partition structures, complete tearing off of the metal film is not to be feared.

Figure 1D:
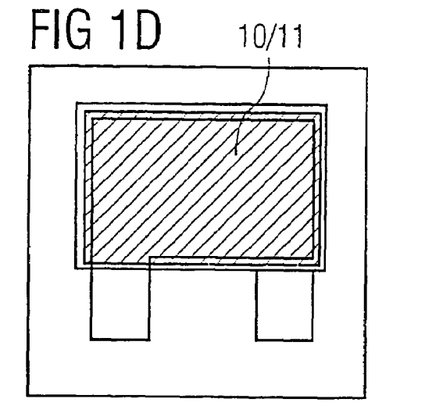

FIG. 1D shows process steps B) and C), in which the first and second functional layer are applied over a large area. Advantageously, these layers 10 and 11 are applied using large-area printing methods, for example, planographic printing methods, such as offset printing, pad printing, porous printing, such as screen printing or stencil printing or also letterpress printing and gravure printing, such as flexographic printing.

Figure 1E:
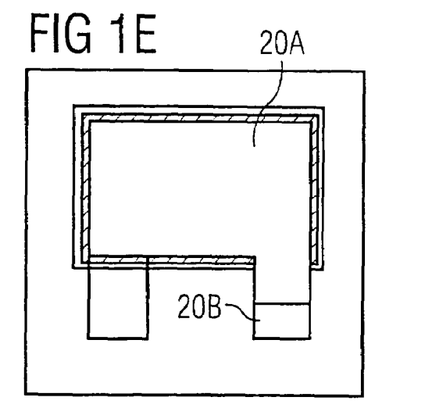

It is shown in FIG. 1E how, in a next process step D) a second electrode layer 20A, which contacts the second electrode connecting piece 20B, is applied over a large area on the functional layers 10 and 11. For example, it is possible to evaporate the second electrode layer over a large area as a metal film, for example, aluminum or magnesium, using a shadow mask.

Figure 1F:
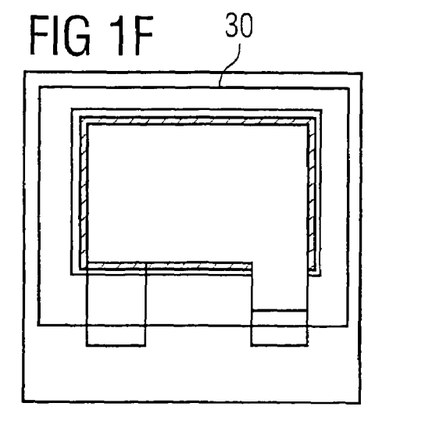

In the next process step E), as shown in FIG. 1F, a cover 30 can be applied onto the area of functional layers 10 and 11, the second electrode layer 20A and one end each of the first and second electrode connecting piece 15B and 20B. This cover 30 can be, for example, a plastic.

FIGS. 1H to 1P explain another example of the method according to the invention for application of the functional electroluminescent layers of large area, using the example of a rotating roller printing method.

Figure 1H:
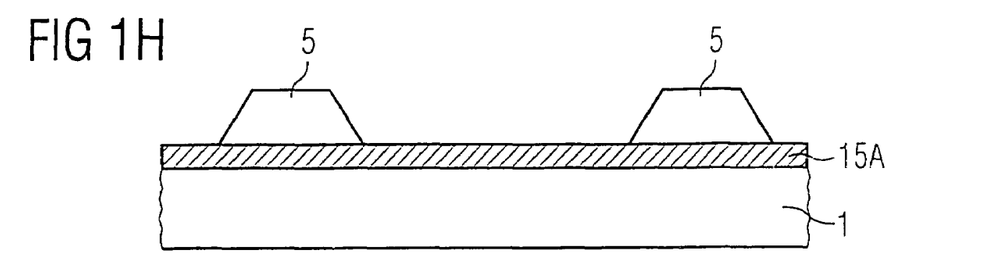
FIGS. 1H to 1P show another possible variation of a method according to the invention, in cross-section.

FIG. 1H shows in cross-section the schematic structure of a substrate 1 with a first electrode layer 15A and spacers 5 before the beginning of the printing process (process steps B) and C)). The spacers 5 are produced after the application of the first electrode layer 15A onto substrate 1 in the first process step A) of the method according to the invention.

Figure 1I:
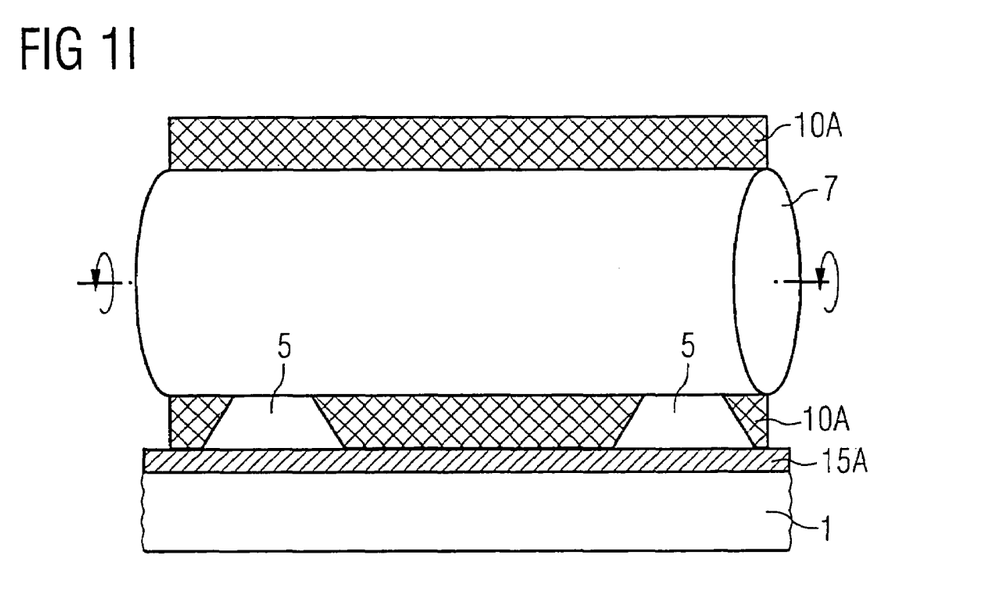

FIG. 1I shows the arrangement in cross-section during the second process step B). A rotating print roll 7 transfers the first functional layer 10A in the printable (liquid) state onto substrate 1.

Figure 1J:
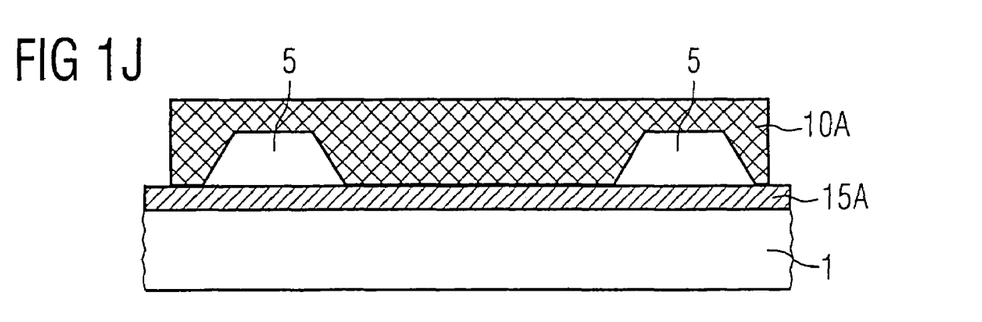

FIG. 1J shows the first functional layers 10A after process step B) before drying. Since the layer thickness of the functional layer, for example, 5 μm, is usually larger than the maximum height of the spacer, which can be 2 μm, the raised parts of the spacer are completely covered by the functional layers, so that a flat surface is produced on the substrate.

Figure 1K:
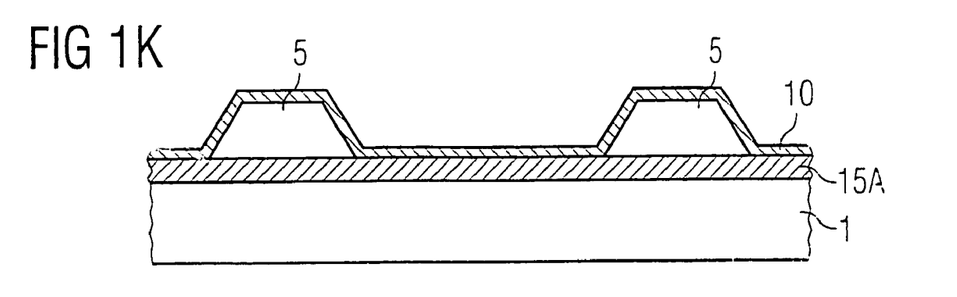

FIG. 1K shows the first printed functional layer 10 after drying. Since the printable functional layers contain a very large amount of solvent (up to 99%), these layers shrink considerably during the drying process due to the evaporation of the solvent. Thus, the layer thickness of an electroluminescent layer decreases during drying, for example, from 5 μm to about 75 nm. As a result of this, the spacers will be higher than the already applied functional layer and thus their function during the application of the second functional layer in process step C) can be exhibited.

Figure 1L:
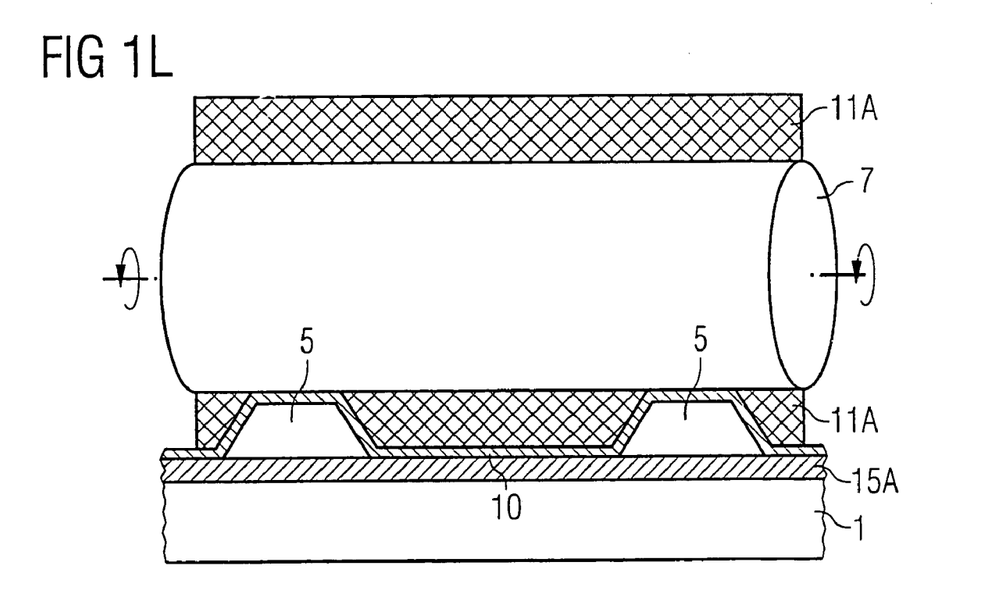

FIG. 1L shows the large-area printing of the second functional layer 11A in the liquid state during process step C). Here, the spacers prevent print roll 7 from coming too near to a portion of the first functional layer that is between the spacers and damaging it. Since, as already mentioned in FIG. 1J, the thickness of the second functional layer on the print roll is greater than the maximum height of the spacers, transfer of the functional layer from the print roll to the substrate is still possible.

Figure 1M:
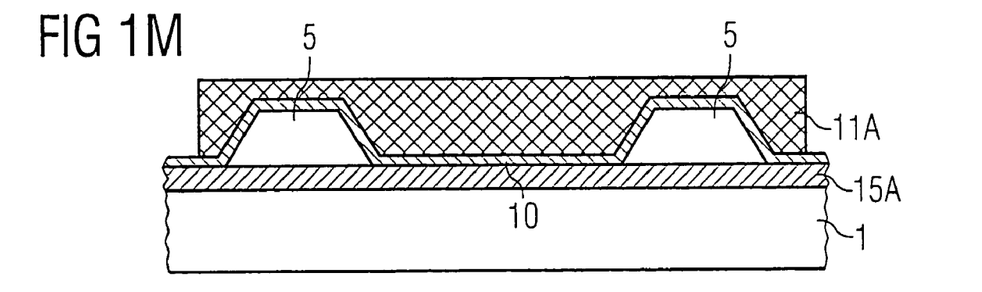

FIG. 1M shows the second functional layer 11A directly after process step C) before drying. Analogously to that shown in FIG. 1J, a flat surface is produced, since the spacer is completely covered.

Figure 1N:
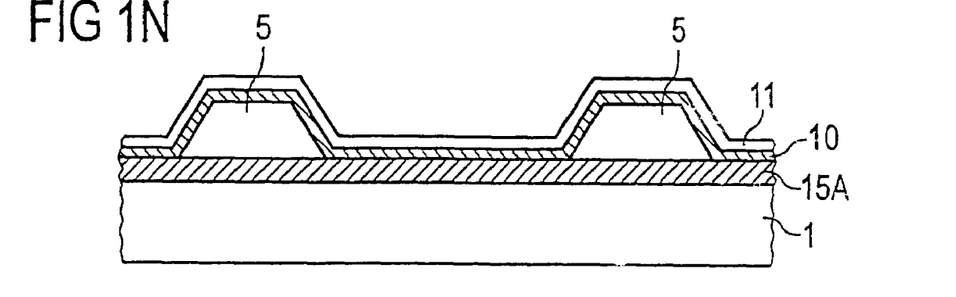

After drying of the second functional layer, as shown in FIG. 1N, the elevations of the spacers protrude again. As a result, it becomes possible, with the method according to the invention, to print more than two mechanically sensitive functional layers on top of one another.

Figure 1O:
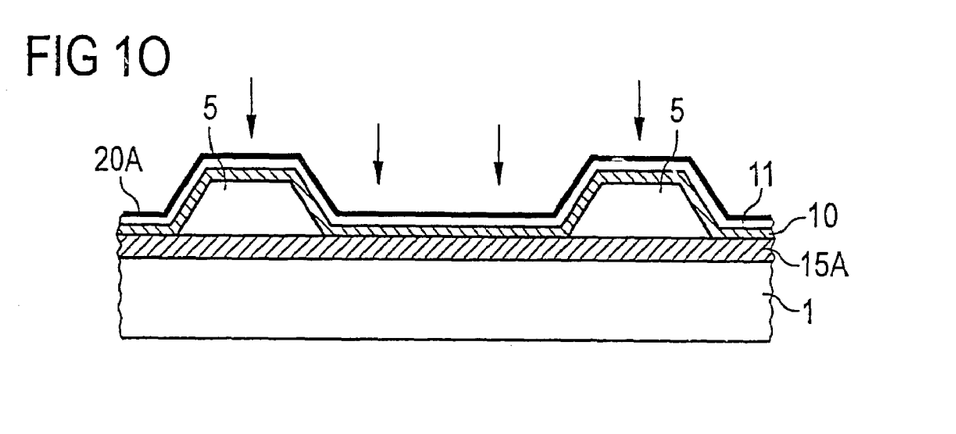

FIG. 1O shows how the second electrode layer 20A is applied onto the functional layers over a large area. This can be achieved, for example, by evaporating a metal film over a large area through a shadow mask.

Figure 1P:
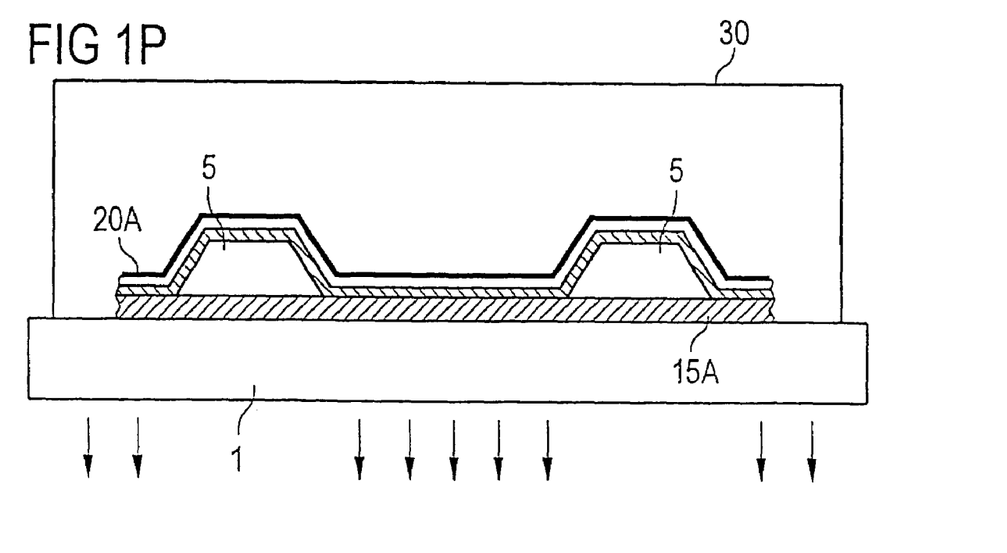

FIG. 1P shows how a cover 30 is applied so that it covers the second electrode layer and the functional layers. It can consist, for example, of plastic or glass. The arrows show schematically the direction in which the electroluminescent light can be radiated through the transparent substrate 1 and the transparent first electrode layer 15A. Only those areas of the two functional layers 10 and 11 will emit electroluminescence, which are in contact with both electrode layers. In the region of spacers 5, there is no contact of the electroluminescent layers with the first electrode layer 15A, so that these areas do not emit any light.

The following FIGS. 2A to 2H show possible partition structures of the spacers in a top view. However, in principle, other embodiments of the spacers besides partition structures can also be conceived, for example, pegs on the surface to be printed. Since the spacers can still be seen under certain circumstances on the finished display, the esthetic aspect in the design of the spacers may also play a role.

Figure 2A:
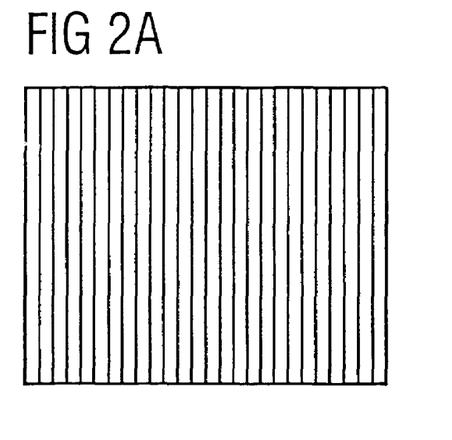
FIGS. 2A to 2H show possible forms of the spacer.
Figure 2B:
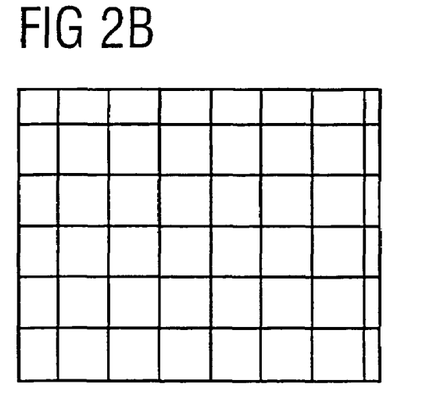
Figure 2C:
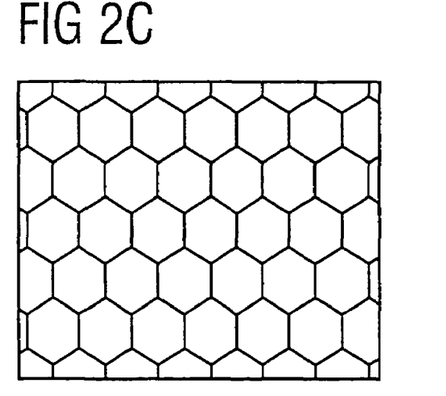
Figure 2D:
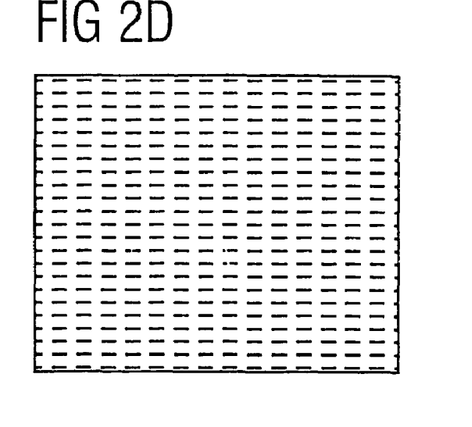
Figure 2E:
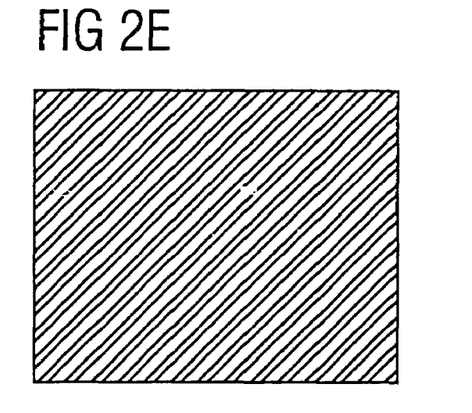
Figure 2F:
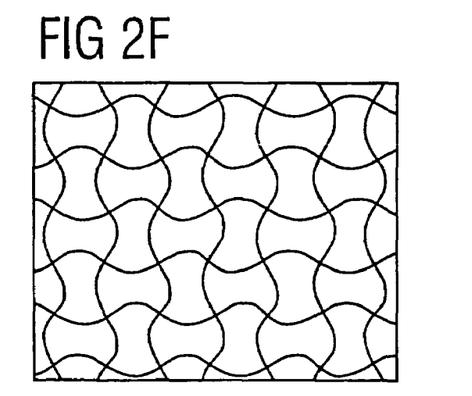
Figure 2G:
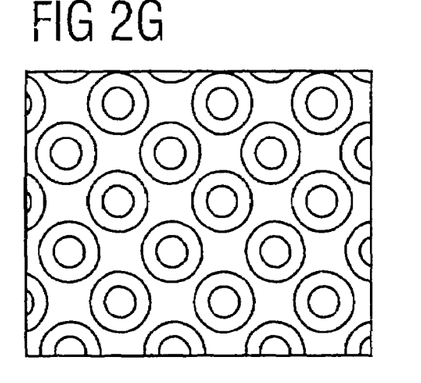
Figure 2H:
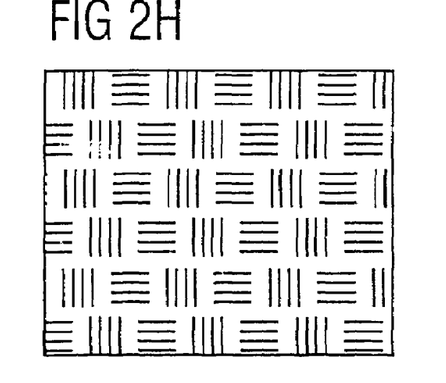

FIG. 2A shows spacers in the form of strip-like partitions arranged parallel to one another. FIG. 2B shows a checkerboard arrangement of strip-like partitions. FIG. 2C shows a honeycomb arrangement of strip-like partitions as spacers 5. FIG. 2D shows interrupted, strip-like partitions which are arranged displaced with respect to one another and are parallel to one another. FIG. 2E shows strip-like partitions which are arranged transversely on the substrate. FIG. 2F shows strip-like, wavy partitions. FIG. 2G shows circular strip-like partitions, while FIG. 2H shows strip-like, interrupted partitions running parallel to one another.

Figure 3:
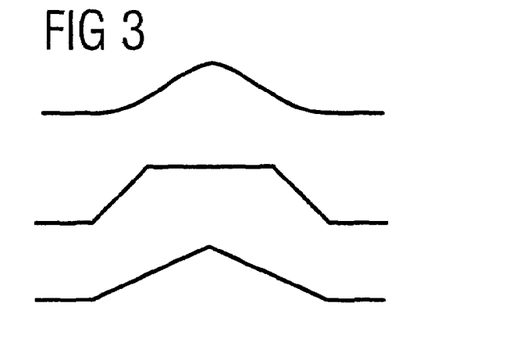
FIG. 3 shows examples of the cross-sections of the spacer.

FIG. 3 shows possible cross-sections of the strip-like partitions as spacers 5. In the areas which are farther removed from the substrate, they have a cross-section becoming smaller, so that a metal film to be applied later on to these types of partitions cannot tear off.

For a whole series of display applications, for example, for handys, i.e., mobile phones, or cockpits, e.g., cockpits of airplanes, so-called icon bars or symbol strips are necessary. These symbols are typically embedded into the partition structures.

Figure 4:
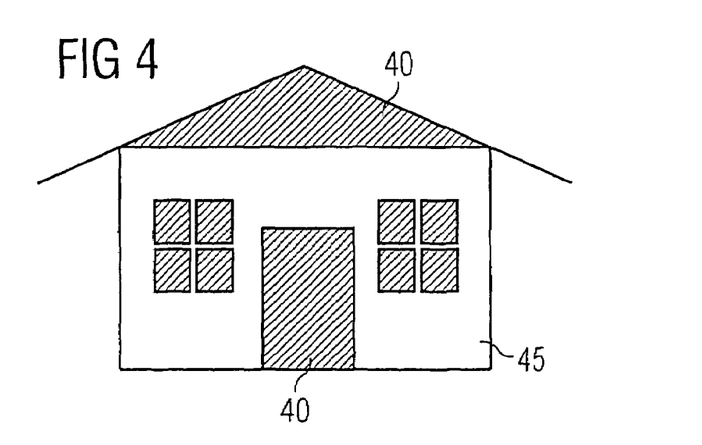
FIG. 4 shows a symbol to be printed.

If the illuminated surfaces of the symbols occupy a larger area, for example, in the case of the symbol in the form of a house shown in FIG. 4, where the black areas designated with 40 should light up and the areas designated with 45 should not light up, it is expedient to fill the illuminating surfaces 40 with spacers 5, so that large-area printing of these areas becomes possible.

The method according to the invention can be also employed in passive matrix displays, whereby, in this case, the first and second electrode layers are structured to strip-like electrode strips perpendicular to one another and the matrix of individually controllable pixels is structured. In the case of passive matrix displays, frequently strip-like partitions are structured which are perpendicular to the first electrode strip and on which a later, second electrode layer applied over a large surface is torn off so that the second electrode strips can be formed. These partitions can, for example, be modified with respect to one another regarding their size and distance, so that, at the same time, they can also function as spacers 5.

The method according to the invention is not limited to the practical examples specifically described here. Especially, with the invention, other mechanically sensitive layers can be produced on top of one another without damage, with a predetermined layer thickness and with high layer thickness homogeneity. Naturally, other variations are also within the framework of the invention, especially regarding the materials used for the spacers as well as their structure.

What is claimed is:

1. A method for application of layers on a substrate, comprising:
    forming a first electrode layer on the substrate;
    forming spacers on the substrate, wherein the spacers have a first surface that is adjacent to the substrate and a second surface that is opposite to the first surface;
    forming a first functional layer on the first electrode layer so that a first portion of the first functional layer is between the spacers and a second portion of the first functional layer is on the second surface of the spacers, wherein the first functional layer is mechanically sensitive;
    printing a second functional layer on the first functional layer with a printing device, wherein the spacers prevent contact between the first portion of the first functional layer and a part of the printing device responsible for printing the second functional layer and the printing applies a first portion of the second functional layer between the spacers and a second portion of the second functional layer on the second surface of the spacers; and
    forming a second electrode layer on the first portion and the second portion of the second function layer.

2. The method of claim 1, wherein:
    forming the spacers includes forming the spacers to have a maximum distance between adjacent spacers, the maximum distance being less than a smallest dimension of the part of the printing device responsible for printing the second functional layer.

3. The method of claim 1, wherein:
    printing the second functional layer includes contacting a portion of the first functional layer that is on the spacers with the part of the printing device responsible for printing the second functional layer;
    forming the spacers includes forming each spacer at a distance from an adjacent spacer sufficient to prevent the part of the printing device responsible for printing the second functional layer from contacting the first portion of the first functional layer.

4. The method of claim 1, wherein:
    forming the spacers includes structuring the spacers into strip-like partitions.

5. The method of claim 4, wherein:
    forming the spacers includes structuring the spacers to have a height between about 0.1 and 100 microns, a width between about 0.3 and 300 microns and a distance between each spacer of between about 2 microns and 10 millimeters.

6. The method of claim 1, wherein:
    forming spacers on a substrate includes forming spacers on a matted substrate;
    forming the first functional layer includes forming a first electroluminescent layer onto a transparent substrate; and
    printing the second functional layer includes printing a second electroluminescent layer.

7. The method of claim 1, wherein the first functional layer is formed on a first surface of the substrate, the method further comprising:
    sandblasting a second surface of the substrate, wherein the second surface is opposite to the first surface.

8. The method of claim 1, wherein:
    forming the spacers includes exposing a photoresist through a mask and developing the photoresist.

9. The method of claim 1, wherein:
    forming the spacers includes printing.

10. The method of claim 1, wherein:
    forming the spacers includes structuring the spacers to have a tapered cross-section that is wider at a portion of the spacer that is closest to the substrate than a portion that is further from the substrate and the cross section of the spacers prevents the second electrode layer on the first portion from being separated from the second electrode portion on the second portion.

11. The method of claim 1, further comprising:
    forming an insulating layer such that the insulating layer is in strip-like partitions, wherein the strip-like partitions serve to delineate boundaries of the first and second functional layers.

12. The method of claim 1, wherein:
    forming the first functional layer includes applying the first functional layer with a large-area printing process.

13. The method of claim 1, wherein:
    forming the second functional layer includes applying the second functional layer with a large-area printing process.

14. The method of claim 1, wherein:
    forming the first functional layer includes at least one printing method from the group consisting of planographic printing, gravure printing, letterpress printing, screen printing and stencil printing.

15. The method of claim 1, wherein:

printing the second functional layer includes at least one printing method from the group consisting of planographic printing, gravure printing, letterpress printing, screen printing and stencil printing.

16. The method of claim 1, further comprising:

forming a first electrode connecting piece and a second electrode connecting piece on the substrate, wherein the first electrode connecting piece electrically contacts the first electrode layer and forming the second electrode layer includes forming the second electrode layer so that the second electrode layer electrically contacts the second electrode connecting piece; and applying a cover onto an area including the first and second functional layers, the second electrode layer and an end of the first and second electrode connecting pieces.

17. The method of claim 1, further comprising encapsulating the first and second electrode layers, the spacers, and the first and second functional layers with an encapsulation, wherein the first electrode layer, the second electrode layer, the first functional layer and the second function layer are each continuous layers under the encapsulation, the first functional layer, the second functional layer and the second electrode layer being continuous from a first region between a first pair of spacers, over one of spacers of the first pair of spacers and to a second region between a second pair of spacers that are adjacent to the first pair of spacers.

18. A method for applying layers on a substrate to form a light emitting device, comprising:

forming a first electrode layer on the substrate, wherein the first electrode layer includes a first electrode connecting piece;

forming spacers on the substrate, wherein the spacers have a first surface that is adjacent to the substrate and a second surface that is opposite to the first surface;

forming a first electroluminescent layer on the substrate, wherein a first portion of the first electroluminescent layer is between the spacers and a second portion of the first electroluminescent layer is on the spacers;

printing a second electroluminescent layer on the first electroluminescent layer with a printing device, wherein the spacers prevent contact between the first portion of the first electroluminescent layer and a part of the printing device responsible for printing the second electroluminescent layer so that a first portion of the second electroluminescent layer is between the spacers and a second portion of the second electroluminescent layer is on the second surface of the spacers;

forming a second electrode layer on the first portion and the second portion of the second electroluminescent layer;

forming a second electrode connecting piece that is in electrical contact with the second electrode layer; and encapsulating the first and second electrode layers, the spacers, and the first and second electroluminescent layers with an encapsulation so that at least one end of the first and second electrode connecting pieces are free from the encapsulation.

19. A method for application of layers on a substrate to form a light emitting device, comprising:

forming a first electrode layer on the substrate;

forming spacers on the substrate, wherein the spacers have a first surface that is adjacent to the substrate and a second surface that is opposite to the first surface;

forming a first organic functional layer on the substrate so that a first portion of the first functional layer is between the spacers and contacts the electrode, wherein the first functional layer is in a liquid state during the forming step and a thickness of the first functional layer is greater than a height of the spacers and a second portion of the first organic function layer is on the second surface of the spacers;

printing a second organic functional layer on the first functional layer with a printing device, wherein the second functional layer is in a liquid state during printing and has a thickness greater than the height of the spacers and the spacers prevent contact between the first portion of the first functional layer and a part of the printing device responsible for printing the second functional layer so that a first portion of the second organic functional layer is between the spacers and a second portion of the second organic functional layer is on the second surface of the spacers; and forming a second electrode layer on the first portion and the second portion of the second organic functional layer.

* * * * *

UNITED STATES PATENT AND TRADEMARK OFFICE
CERTIFICATE OF CORRECTION

PATENT NO. : 7,544,383 B2 Page 1 of 1
APPLICATION NO. : 10/493641
DATED : June 9, 2009
INVENTOR(S) : Jan Birnstock et al.

It is certified that error appears in the above-identified patent and that said Letters Patent is hereby corrected as shown below:

On the Cover Page, (73), Assignee; replace:
"Osram Opto Seminconductor GmbH" with
-- Osram Opto Semiconductors GmbH --

Column 7, Line 67 at Claim 1; replace:
"second portion of the second function layer." with
-- second portion of the second functional layer. --

Column 9, Line 23 at Claim 16; replace:
"the first functional layer and the second function layer are" with
-- the first functional layer and the second functional layer are --

Column 10, Line 28 at Claim 19; replace:
"first organic function layer is on the second surface of the" with
-- first organic functional layer is on the second surface of the --

Signed and Sealed this

Fourth Day of August, 2009

JOHN DOLL
*Acting Director of the United States Patent and Trademark Office*